US012750978B2

(12) United States Patent
Kuo

(10) Patent No.: US 12,750,978 B2
(45) Date of Patent: Sep. 29, 2026

(54) PACKAGE STRUCTURE

(71) Applicant: TMY Technology Inc., Taipei City (TW)

(72) Inventor: Pei-Hung Kuo, Taipei City (TW)

(73) Assignee: TMY Technology Inc., Taipei City (TW)

( * ) Notice: Subject to any disclaimer, the term of this patent is extended or adjusted under 35 U.S.C. 154(b) by 245 days.

(21) Appl. No.: 18/513,650

(22) Filed: Nov. 20, 2023

(65) Prior Publication Data

US 2024/0215202 A1 Jun. 27, 2024

(30) Foreign Application Priority Data

Dec. 23, 2022 (TW) .................................. 111149660

(51) Int. Cl.
*H05K 7/20* (2006.01)
*H05K 1/02* (2006.01)
*H05K 3/28* (2006.01)

(52) U.S. Cl.
CPC ....... *H05K 7/20436* (2013.01); *H05K 1/0209* (2013.01); *H05K 3/284* (2013.01); *H05K 2201/032* (2013.01)

(58) Field of Classification Search
CPC .... H05K 7/20; H05K 7/2039; H05K 7/20418; H05K 7/20436; H05K 7/20445; H05K 7/2049; H05K 7/20509; H05K 1/0201–0212; H05K 1/0271; H05K 1/181; H05K 3/305; H05K 2201/032; H05K 2201/066; H05K 2201/10409; H01L 23/13; H01L 23/3107; H01L 23/3672;

(Continued)

(56) References Cited

U.S. PATENT DOCUMENTS 9,633,919 B2 * 4/2017 Wan .................. H01L 23/49811
9,670,382 B2 6/2017 Tamura et al.

(Continued)

FOREIGN PATENT DOCUMENTS

CN 106961783 7/2017
CN 113299637 8/2021

(Continued)

OTHER PUBLICATIONS

"Office Action of Japan Counterpart Application", issued on Dec. 27, 2024, p. 1-p. 3.

(Continued)

*Primary Examiner* — Amir A Jalali
(74) *Attorney, Agent, or Firm* — JCIPRNET

(57) ABSTRACT

A package structure includes a substrate having a bearing surface, an electronic component disposed on the bearing surface and having a first height, at least one heat conductor disposed on the bearing surface and having a second height, an encapsulant disposed on the bearing surface and having a side covering the electronic component and the at least one heat conductor and a third height, and a heat dissipation structure disposed on the encapsulant. The third height is greater than or equal to the first height and the second height. A surrounding area where the substrate is in contact with the electronic component is a heat-generating area, and the at least one heat conductor is disposed in the heat-generating area.

12 Claims, 7 Drawing Sheets

(58) Field of Classification Search
CPC ............. H01L 23/3675; H01L 23/4334; H01L 23/49811; H01L 23/552; G06F 1/20; G06F 1/203; G06F 1/206
See application file for complete search history.

(56) References Cited

U.S. PATENT DOCUMENTS

| | | | | |
|---|---|---|---|---|
| 12,048,083 | B2 * | 7/2024 | Mardi | H05K 1/0203 |
| 2002/0113306 | A1 * | 8/2002 | Kwon | H01L 23/49838 257/E23.079 |
| 2006/0094161 | A1 * | 5/2006 | Tao | H01L 21/565 257/E23.092 |
| 2009/0273076 | A1 * | 11/2009 | Choi | H10W 70/65 257/E23.101 |
| 2010/0299918 | A1 * | 12/2010 | Oda | H01L 23/3733 29/841 |
| 2011/0291249 | A1 * | 12/2011 | Chi | H01L 23/5389 438/122 |
| 2014/0211421 | A1 * | 7/2014 | Mishrikey | H05K 1/0209 361/717 |
| 2015/0348936 | A1 * | 12/2015 | Lin | H01L 24/19 257/659 |
| 2015/0382448 | A1 | 12/2015 | Pennathur et al. | |
| 2017/0164460 | A1 * | 6/2017 | Choi | H05K 1/0203 |
| 2021/0111153 | A1 * | 4/2021 | Lin | H01L 24/08 |
| 2021/0193544 | A1 * | 6/2021 | Lin | H01L 21/565 |
| 2021/0327866 | A1 * | 10/2021 | Yu | H01L 25/50 |
| 2021/0366839 | A1 | 11/2021 | Otsubo et al. | |
| 2022/0159825 | A1 * | 5/2022 | Otsubo | H05K 1/0218 |
| 2022/0338369 | A1 * | 10/2022 | Wei | H05K 7/20509 |
| 2023/0154865 | A1 * | 5/2023 | Pu | H01L 21/4882 257/668 |
| 2023/0232527 | A1 * | 7/2023 | Nomura | H05K 1/0218 361/748 |
| 2023/0317564 | A1 * | 10/2023 | Chen | H01L 25/18 |
| 2023/0369188 | A1 * | 11/2023 | Hsieh | H01L 23/562 |
| 2024/0284591 | A1 * | 8/2024 | Takakura | H05K 1/0271 |
| 2025/0071906 | A1 * | 2/2025 | Kubo | H05K 1/18 |

FOREIGN PATENT DOCUMENTS

| | | |
|---|---|---|
| CN | 113990816 | 1/2022 |
| JP | 2006120996 | 5/2006 |
| JP | 2020004886 | 1/2020 |
| TW | I278046 | 4/2007 |
| TW | 200910548 | 3/2009 |
| TW | I335792 | 1/2011 |
| TW | I555147 | 10/2016 |
| TW | I713174 | 12/2020 |
| TW | I773500 | 8/2022 |
| WO | 2020148800 | 7/2020 |

OTHER PUBLICATIONS

"Office Action of Taiwan Counterpart Application", issued on Nov. 23, 2023, p. 1-p. 10.
"Notice of allowance of Japan Counterpart Application", issued on Apr. 1, 2025, p. 1-p. 3.

* cited by examiner

PACKAGE STRUCTURE

CROSS-REFERENCE TO RELATED APPLICATION

This application claims the priority benefit of Taiwan application serial no. 111149660, filed on Dec. 23, 2022. The entirety of the above-mentioned patent application is hereby incorporated by reference herein and made a part of this specification.

BACKGROUND

Technical Field

The disclosure relates to a structure, and in particular, to a package structure.

Description of Related Art

As the power output of the electronic products today continues to increase, the heat emitted by the electronic components in the package structure also increases. As a result, the performance of the product may be reduced due to the excessive temperature of the electronic components and the circuit boards. Therefore, how to effectively improve the heat dissipation performance of the package structure is a problem that needs to be solved at present.

SUMMARY

The disclosure provides a package structure with excellent heat dissipation performance.

A package structure of the disclosure includes a substrate having a bearing surface, an electronic component disposed on the bearing surface and having a first height, at least one heat conductor disposed on the bearing surface and having a second height, an encapsulant disposed on the bearing surface and having a side covering the electronic component and the at least one heat conductor and a third height, and a heat dissipation structure disposed on the encapsulant. The third height is greater than or equal to the first height and the second height. A surrounding area where the substrate is in contact with the electronic component is a heat-generating area, and the at least one heat conductor is disposed in the heat-generating area.

In an embodiment of the disclosure, the ratio of the second height to the third height is not less than 0.6 and not greater than 1.

In an embodiment of the disclosure, the difference between the third height and the first height is less than 0.3 mm.

In an embodiment of the disclosure, the top surface of the encapsulant is substantially aligned with the top surface of the at least one heat conductor.

In an embodiment of the disclosure, the package structure further includes a heat interface material disposed between the heat dissipation structure and the encapsulant.

In an embodiment of the disclosure, the substrate includes a printed circuit board or a low temperature co-fired ceramic circuit board.

In an embodiment of the disclosure, the substrate includes a cavity, and the orthographic projection of the cavity on the substrate overlaps the orthographic projection of the electronic component on the substrate.

In an embodiment of the disclosure, the material of the at least one heat conductor includes metal material or ceramic material.

In an embodiment of the disclosure, the metal material includes copper or aluminum, and the ceramic material includes aluminum nitride, boron nitride, indium nitride, or boron arsenide.

In an embodiment of the disclosure, the ratio of the sum of the orthographic projection area of the at least one heat conductor on the substrate to the sum of the orthographic projection area of the electronic component on the substrate is 0.4 or more in the heat-generating area.

In an embodiment of the disclosure, the electronic component is provided in plurality, and the at least one heat conductor is disposed between the adjacent electronic components.

In an embodiment of the disclosure, the at least one heat conductor is provided in plurality, and the multiple heat conductors are disposed around the electronic component.

In an embodiment of the disclosure, the at least one heat conductor and the heat dissipation structure are integrally formed.

Based on the above, the package structure of the disclosure includes the heat conductors and the electronic components disposed on the substrate, and the heat conductors are located in the heat-generating area, which may effectively conduct the heat emitted by the electronic components to reduce the temperature of the electronic components, so that the temperature accumulated on the bearing surface of the substrate may be reduced and the overall heat dissipation effect of the package structure may be improved so as to further improve the reliability thereof.

DETAILED DESCRIPTION OF DISCLOSED EMBODIMENTS

Figure 1:
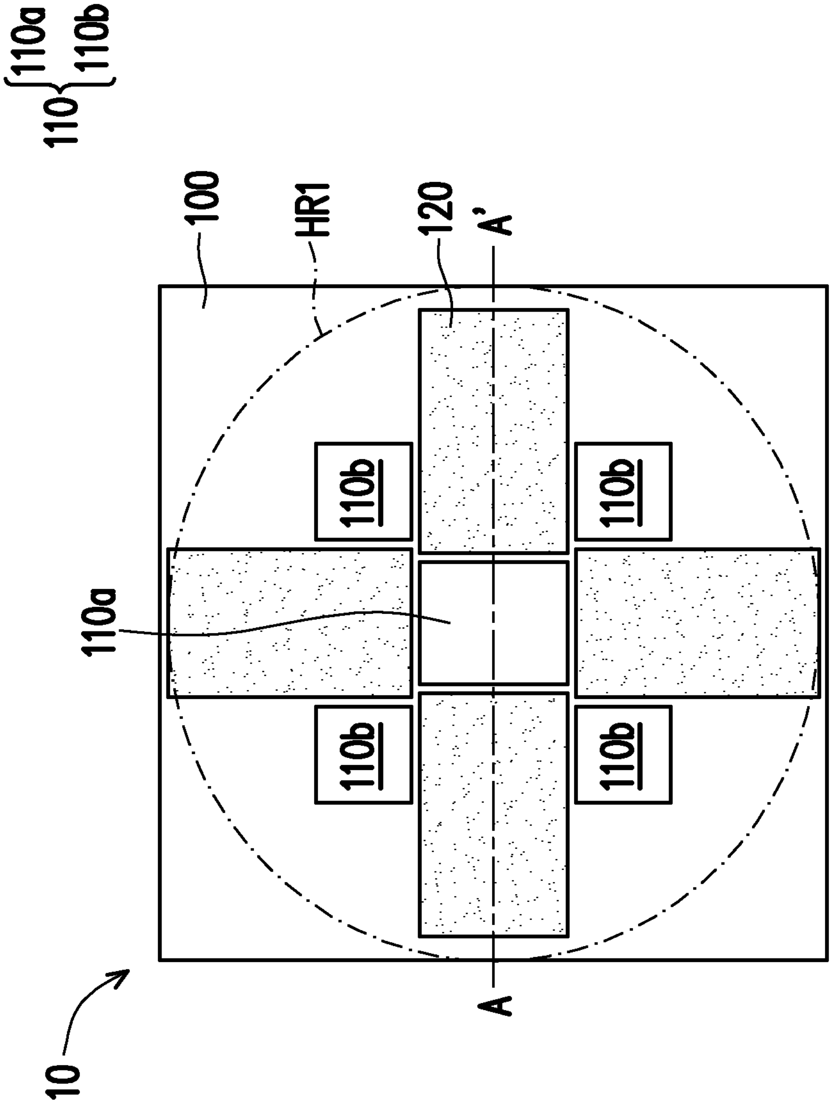
FIG. 1 is a partial top schematic diagram of a package structure according to an embodiment of the disclosure.
Figure 2:
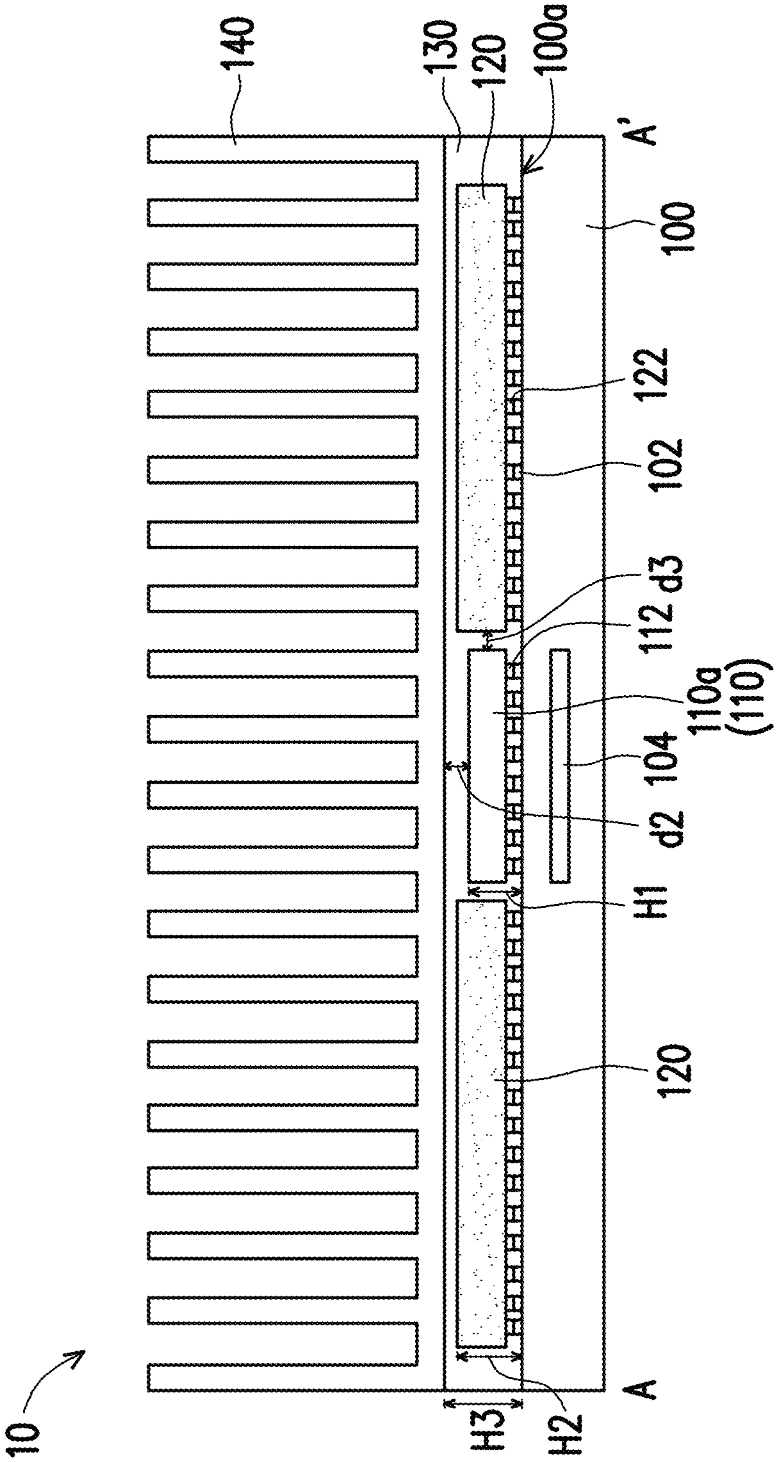
FIG. 2 is a partial cross-sectional schematic diagram of a package structure according to an embodiment of the disclosure.

FIG. 1 is a partial top schematic diagram of a package structure according to an embodiment of the disclosure. FIG. 2 is a partial cross-sectional schematic diagram of a package structure according to an embodiment of the disclosure. FIG. 2 may be a cross-sectional schematic diagram of an embodiment along the sectional line A-A' of FIG. 1. For clarity, only the substrate, the electronic component, and the heat conductor are shown in FIG. 1, and the other omitted parts may be understood with reference to FIG. 2.

Referring to FIG. 1 and FIG. 2, a package structure 10 includes a substrate 100 having a bearing surface 100*a*, an electronic component 110 disposed on the bearing surface 100*a* and having a first height H1, at least one heat conductor 120 disposed on the bearing surface 100*a* and having a second height H2, an encapsulant 130 disposed on the bearing surface 100*a* and having a side covering the electronic component 110 and the at least one heat conductor 120 and a third height H3, and a heat dissipation structure 140 disposed on the encapsulant 130. The third height H3 is greater than or equal to the first height H1 and the second height H2. The surrounding area where the substrate 100 is in contact with the electronic component 110 is a heat-generating area HR1, and the at least one heat conductor 120 is disposed in the heat-generating area HR1. Herein, the first height H1 refers to the distance from the top surface of the electronic component 110 (i.e., the surface of the electronic component 110 away from the substrate 100) to the bearing surface 100*a*. The second height H2 refers to the distance from the top surface of the heat conductor 120 (i.e., the surface of the heat conductor 120 away from the substrate 100) to the bearing surface 100*a*. The third height H3 refers to the distance from the top surface of the encapsulant 130 (i.e., the surface of the encapsulant 130 away from the substrate 100) to the bearing surface 100*a*.

The substrate 100 may be a circuit substrate, such as a printed circuit board, a low temperature co-fired ceramic circuit board or other suitable substrates, and the disclosure is not limited thereto. The substrate 100 may include multiple substrate pads 102 disposed on the bearing surface 100*a* for connecting with the electronic component 110 or the heat conductor 120. The internal structure of the substrate 100 is omitted in FIG. 2, but it should be understood that the substrate 100 may include structures such as conductive lines, insulation layers, and via holes, and the wiring design thereof may be adjusted according to actual needs, and the disclosure is not limited thereto.

In some embodiments, the substrate 100 may include an air gap 104 or a hollowed cavity 104 so that the substrate 100 has more flexibility in the wiring design. The air gap 104 may be disposed corresponding to the electronic component 110. For example, the orthographic projection of the air gap 104 on the substrate 100 may overlap the orthographic projection of the electronic component 110 on the substrate 100.

The electronic component 110 is, for example, an active component (such as an integrated circuit (IC) chip), a power amplifier, or other electronic components that emit heat. For example, in FIG. 1, the electronic component 110 is provided in plurality, and includes a first electronic component 110*a* and multiple second electronic components 110*b*. The multiple second electronic components 110*b* are centered on the first electronic component 110*a* and disposed on the diagonal extension line of the first electronic component 110*a*, so that the multiple electronic components 110 are arranged in a staggered manner. In some embodiments, the first electronic component 110*a* may be an IC chip, and the second electronic component 110*b* may be a power amplifier, but the disclosure is not limited thereto. The type, the quantity, and the arrangement of the electronic component 110 may depend on the actual situation, that is to say, the electronic component 110 may be one or more electronic components of the same type or different types, disposed in a staggered arrangement, in an arrayed arrangement, or in other arrangements, and may be adjusted according to actual needs.

The electronic component 110 may include multiple external pads 112 for connecting with the corresponding substrate pads 102. The surrounding area where the electronic component 110 is in contact with the substrate 100 is the heat-generating area HR1, which may be defined as the area where the temperature of the substrate 100 in the working state of the electronic component 110 is higher by more than 50 degrees Celsius the temperature of the substrate 100 in the non-working state of the electronic component 110, or the area where the temperature of the substrate 100 around the electronic component 110 and the temperature of the electronic component 110 in the working state differ within 20 degrees Celsius (e.g., when the temperature of the electronic component 110 is 180 degrees Celsius in the working state, the heat-generating area HR1 refers to the area where the temperature of the substrate 100 around the electronic component 110 is above 160 degrees Celsius). The heat-generating area HR1 defined above is a situation where there is no heat conductor 120 on the substrate 100.

The heat conductor 120 may conduct away the heat emitted by the electronic component 110 and the heat energy accumulated on the bearing surface 100*a* of the substrate 100, thereby reducing the overall temperature of the package structure 10. The heat conductor 120 may include metal material or ceramic material, and the heat conductivity thereof may be 30 W/m·K or more. In embodiment, the heat conductor 120 is a ceramic material, such as aluminum nitride, boron nitride, indium nitride, boron arsenide, or other suitable ceramic materials. When the heat conductor 120 is a ceramic material, it may be a ball planted on one side of the heat conductor 120 to form a connector 122, and the heat conductor 120 is connected to the substrate pad 102 through the surface mount technology, so as to be fixed on the substrate 100. In other embodiments, the heat conductor 120 may be a metal heat-conducting material such as copper and aluminum, and the disclosure is not limited thereto. The drawings schematically show multiple heat conductors 120, but the disclosure is not limited thereto, and the number and the arrangement of the heat conductors 120 may be adjusted according to actual conditions.

In some embodiments, the orthographic projection of the heat conductor 120 on the substrate 100 does not overlap the orthographic projection of the electronic component 110 on the substrate 100, that is to say, the heat conductor 120 and the electronic component 110 may be disposed on the substrate 100 side by side. In some embodiments, at least one heat conductor 120 may be disposed between the adjacent electronic components 110 so as to conduct away the heat energy of the electronic components 110. The disclosure does not limit the distance between the heat conductor 120 and the electronic component 110, but the distance should be as small as possible so that the heat conductor 120 is located in the heat-generating area HR1 to effectively transfer the heat emitted by the electronic component 110 to the heat conductor 120.

In some embodiments, the ratio of the sum of the orthographic projection area of the heat conductor 120 on the substrate 100 to the sum of the orthographic projection area of the electronic component 110 on the substrate 100 is 0.4 or more in the heat-generating area HR1. In this way, the heat dissipation area may be increased, which is beneficial to the heat dissipation of the electronic component 110, thereby reducing the accumulation of the heat energy on the substrate 100.

In some embodiments, the ratio of the second height H2 to the third height H3 (i.e., H2/H3) is not less than 0.6 and not greater than 1. The disclosure does not limit the size of the second height H2 and the third height H3, which may be adjusted according to actual needs, as long as the ratio of the second height H2 to the third height H3 is within the above range. In this way, the heat dissipation of the electronic component 110 may be facilitated, thereby reducing the accumulation of the heat energy on the substrate 100. When the ratio of the second height H2 to the third height H3 is less than 0.6, the heat conducted from the electronic component 110 to the heat conductor 120 is limited, and the heat dissipation effect of the heat conductor 120 on the electronic component 110 is not significant. When the ratio of the second height H2 to the third height H3 is greater than 1, the heat conducted from the electronic component 110 to the heat conductor 120 reaches a critical level, which limits the improvement of the heat dissipation effect of the heat conductor 120 on the electronic component 110, and instead increases the cost.

In some embodiments, the shape of the orthographic projection of the heat conductor 120 on the substrate 100 may be a rectangle, a circle, a polygon, etc., and the disclosure is not limited thereto.

The encapsulant 130 may include an epoxy resin, a molding compound, or other suitable insulating film encapsulation materials. In embodiment, the encapsulant 130 covers the top surfaces of the heat conductor 120 and the electronic component 110, that is to say, the third height H3 is greater than the first height H1 and the second height H2, but the disclosure is not limited thereto. In other embodiments, the top surface of the encapsulant 130 may be substantially aligned with the top surface of the heat conductor 120 and/or the top surface of the electronic component 110, that is to say, the third height H3 may be substantially equal to the second height H2 and/or or the first height H1. In other words, the top surface of the heat conductor 120 and/or the electronic component 110 may not be covered by the encapsulant 130.

In some embodiments, a distance d2 between the top surface of the encapsulant 130 and the top surface of the electronic component 110 (i.e., the difference between the third height H3 and the first height H1) is less than 0.3 millimeters (mm).

The heat dissipation structure 140 may be, for example, a heat dissipation fin or other suitable heat sink devices. The material of the heat dissipation structure 140 may be copper, aluminum, or other suitable materials, and the disclosure is not limited thereto. In some embodiments, air flow may be passed through the heat dissipation structure 140 to take away the heat energy thereof, so as to improve the heat dissipation effect.

Figure 3:
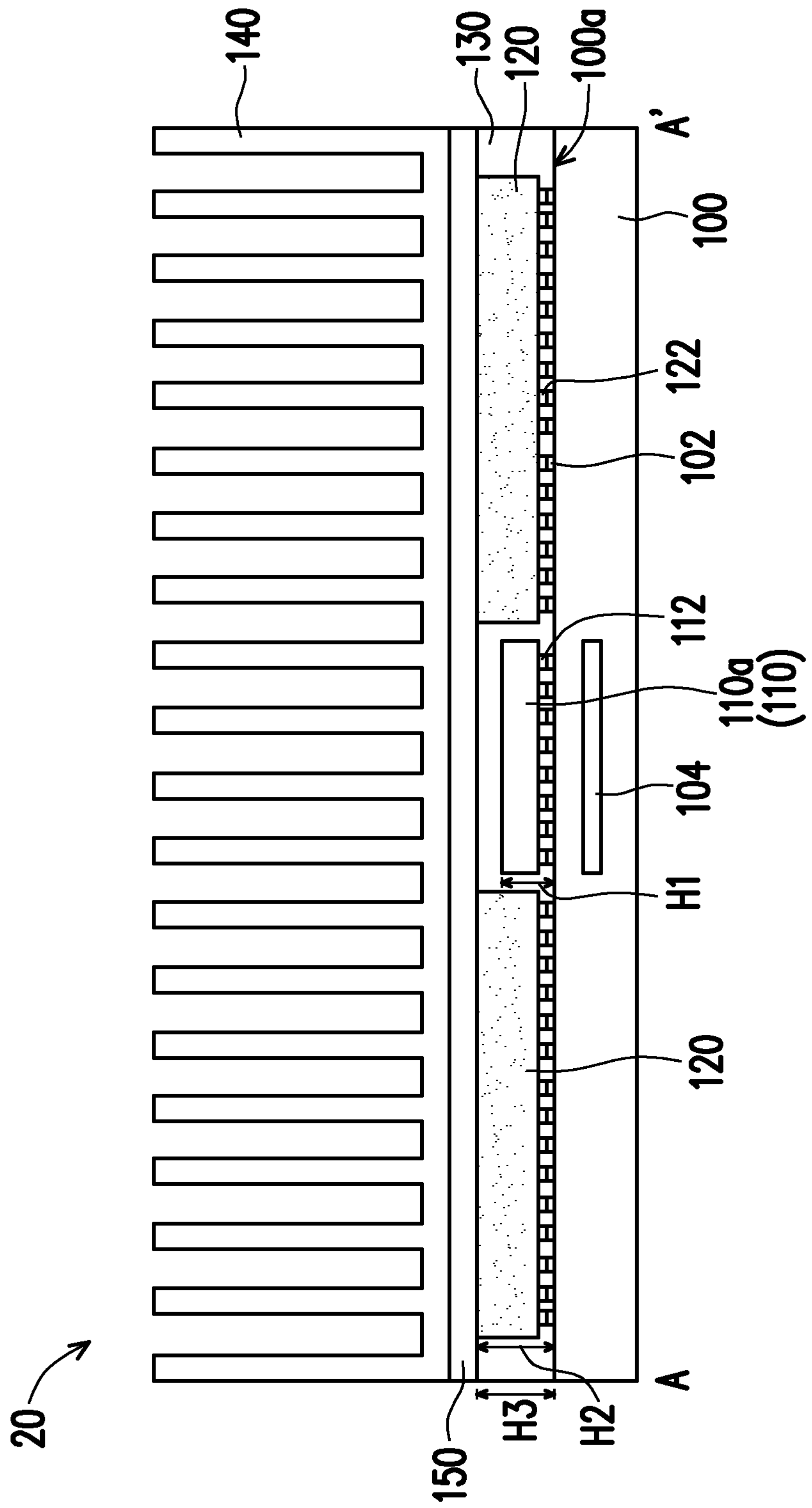
FIG. 3 is a partial cross-sectional schematic diagram of a package structure according to another embodiment of the disclosure.

FIG. 3 is a partial cross-sectional schematic diagram of a package structure according to another embodiment of the disclosure. The top schematic diagram of FIG. 3 may be similar to FIG. 1, and may be understood with reference to FIG. 1. It must be noted here that the embodiment of FIG. 3 continues to use the referential numbers of the components and a part of the contents of the embodiment of FIG. 2, wherein the same or similar referential numbers are used to denote the same or similar components, and the description of the same technical content is omitted. For the description of the omitted part, reference may be made to the foregoing embodiments, and the details are not repeated here.

Referring to FIG. 3, the main difference between a package structure 20 and the package structure 10 is that the package structure 20 further includes a heat interface material 150 disposed between the heat dissipation structure 140 and the encapsulant 130. In some embodiments, the heat conductor 120 and/or the electronic component 110 may be connected to the heat dissipation structure 140 through the heat interface material 150 to reduce the heat resistance between the heat conductor 120 and/or the electronic component 110 and the heat dissipation structure 140. The heat interface material 150 may be, for example, a heat paste, a thermal pad, a metal sheet, or other suitable heat interface materials. In FIG. 3, the top surface of heat conductor 120 is substantially aligned with the top surface of encapsulant 130 and is in direct contact with heat interface material 150. However, the disclosure is not limited thereto. In other embodiments, the electronic component 110 may also be substantially aligned with the top surface of the encapsulant 130 and be in direct contact with the heat interface material 150.

Figure 4:
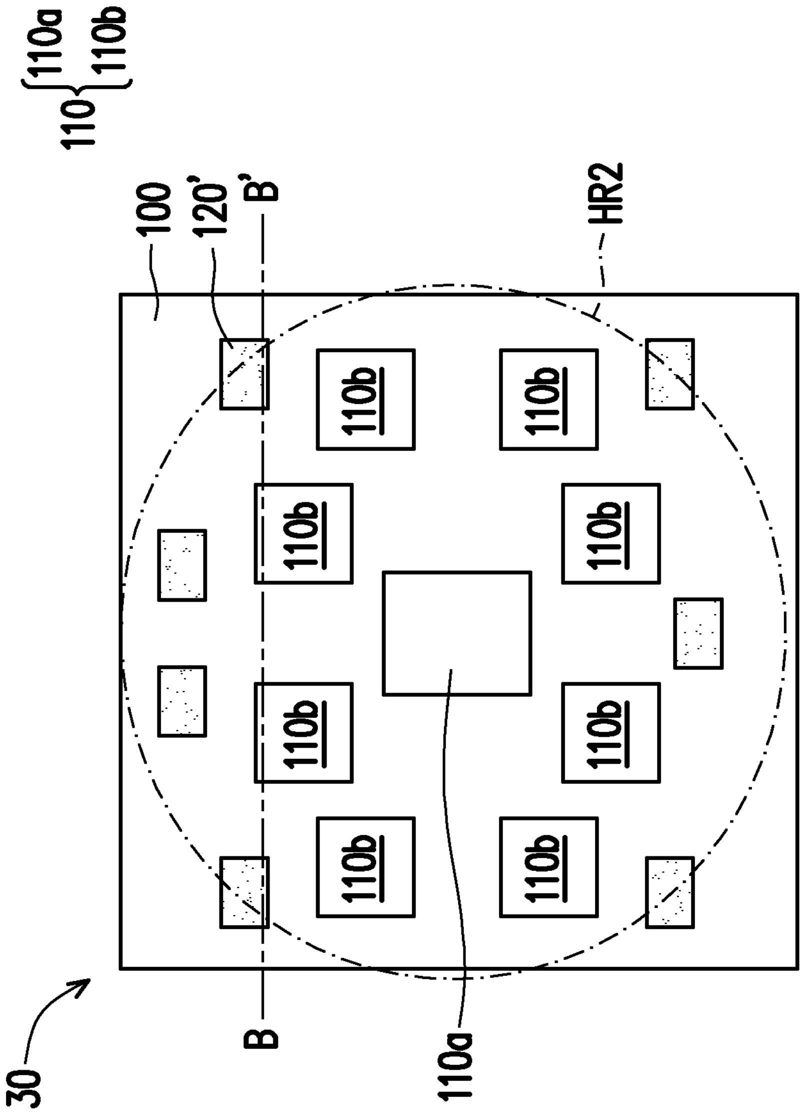
FIG. 4 is a partial top schematic diagram of a package structure according to another embodiment of the disclosure.
Figure 5:
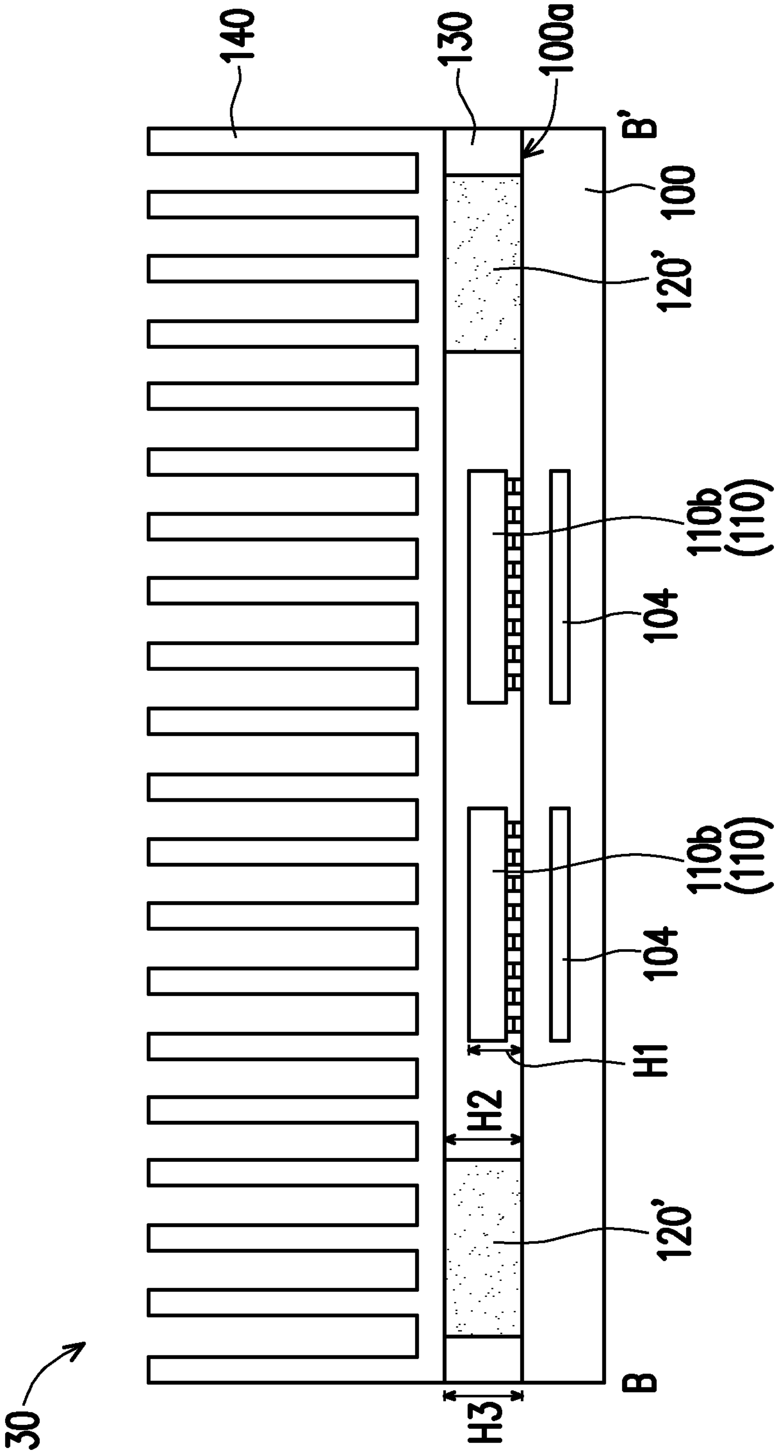
FIG. 5 is a partial cross-sectional schematic diagram of a package structure according to another embodiment of the disclosure.

FIG. 4 is a partial top schematic diagram of a package structure according to another embodiment of the disclosure. FIG. 5 is a partial cross-sectional schematic diagram of a package structure according to another embodiment of the disclosure. FIG. 5 may be a cross-sectional schematic diagram of an embodiment along the sectional line B-B' of FIG. 4. For clarity, only the substrate, the electronic component, and the heat conductor are shown in FIG. 4, and the other omitted parts may be understood with reference to FIG. 5. It must be noted here that the embodiment of FIG. 4 and FIG. 5 continues to use the referential numbers of the components and a part of the contents of the embodiment of FIG. 1 and FIG. 2, wherein the same or similar referential numbers are used to denote the same or similar components, and the description of the same technical content is omitted. For the description of the omitted part, reference may be made to the foregoing embodiments, and the details are not repeated here.

Referring to FIG. 4 and FIG. 5, the main difference between a package structure 30 and the package structure 10 is that multiple heat conductors 120' of the package structure 30 are disposed around the multiple electronic components 110. For example, the multiple electronic components 110 may include the first electronic component **110*a* and the multiple second electronic components 110*b* centered on the first electronic component 110*a* and disposed around the first electronic component 110*a*. In some embodiments, the first electronic component 110*a* may be an IC chip, and the second electronic component 110*b* may be a power amplifier, but the disclosure is not limited thereto, and the first electronic component 110*a* and the second electronic component 110*b* may be electronic components of the same type or different types. In addition, the multiple heat conductors 120' are disposed around the multiple second electronic components 110*b*. The surrounding area where the substrate 100 is in contact with the electronic component 110 is a heat-generating area HR2, and the at least one heat conductor 120' is disposed in the heat-generating area HR2. In some embodiments, the multiple heat conductors 120'** may be disposed along the edge of the heat-generating area HR2.

In embodiment, the heat conductor 120' is a metal material, such as a copper block, which may be connected to the substrate pad by soldering. Since the heat conductor 120' is made of the same material as the substrate pad, the heat conductor 120' and the substrate pad may not be easily distinguished, so the substrate pad connected to the heat conductor 120' is not shown in FIG. 5. In other embodiments, the heat conductor 120' may also be a ceramic material, so as to be connected to the substrate pads similarly to the embodiment of FIG. 2.

In FIG. 5, the second height H2 of the heat conductor 120' is substantially the same as the third height H3 of the encapsulant 130. That is to say, the top surface of the heat conductor 120' is substantially coplanar with the top surface of the encapsulant 130, and the top surface of the heat conductor 120' may be in direct contact with the heat dissipation structure 140. However, the disclosure is not limited thereto, and in other embodiments, the film encapsulation 130 may cover the top surface of the heat conductor 120'. In addition, the encapsulant 130 may cover the top surface of the electronic component 110, or be aligned with the top surface of the electronic component 110 and be in direct contact with the heat dissipation structure 140, and the disclosure is not limited thereto.

In some embodiments, the heat conductor 120' and the heat dissipation structure 140 may be integrally formed. At this time, the material of the heat conductor 120' is the same as the material of the heat dissipation structure 140, such as copper or other suitable metal materials. The assembly method may be, for example, after the electronic component 110 is disposed on the substrate 100, the integrally formed heat conductor 120' and the heat dissipation structure 140 are disposed on the substrate 100 with the heat conductor 120' facing the substrate 100, and then a encapsulant 130 is formed in the gap between the substrate 100 and the heat dissipation structure 140 to laterally cover the heat conductor 120' and the electronic component 110 so as to form the package structure 30. In other embodiments, the heat conductor 120' and the heat dissipation structure 140 may be two separate components, and may be connected to the heat dissipation structure 140 through a heat interface material or directly, and the disclosure is not limited thereto.

In some embodiments, the shape of the orthographic projection of the heat conductor 120' on the substrate 100 may be a rectangle, a circle, a polygon, etc., and the disclosure is not limited thereto.

were power amplifiers. The multiple heat conductors 120 were disposed on the substrate 100 and located between the adjacent second electronic components **110*b*. The materials thereof were aluminum nitride, and each had the same volume. The second height H2 of the heat conductor 120 was the same as the first height H1 of the electronic component 110. The encapsulant 130 covered the side surfaces and the top surfaces of the first electronic component 110*a*, the second electronic component 110*b*, and the heat conductor 120. The heat dissipation structure 140 was disposed on the encapsulant 130**, and passed through the room temperature air flow at a velocity of 2 meters per second (m/s).

The experimental example 2 was similar to the experimental example 1, except that the substrate of the experimental example 2 was a low temperature co-fired ceramic circuit board (LTCC), which did not have a cavity.

Experimental example 3 was similar to experimental example 2, except that the low temperature co-fired ceramic circuit board of experimental example 3 had a cavity.

Comparative example 1 to comparative example 3 were similar to experimental example 1 to experimental example 3 respectively, except that the package structures of comparative example 1 to comparative example 3 did not include the heat conductors.

When experimental example 1 to experimental example 3 and comparative example 1 to comparative example 3 were under the same simulation conditions, the package structure was numerically simulated in the working mode, and the junction temperature of each electronic component was obtained as shown in Table 1 below (BF IC in Table 1 refers to the first electronic component **110*a*, and PA1, PA2, PA3, and PA4 refer to the multiple second electronic components 110*b* arranged sequentially in a clockwise direction from the upper right corner of the first electronic component 110*a* in FIG. 1**).

TABLE 1

| | PCB | | | LTCC (without cavity) | | | LTCC (with cavity) | | |
|---|---|---|---|---|---|---|---|---|---|
| | Experimental example 1 | Comparative example 1 | Temperature difference | Experimental example 2 | Comparative example 2 | Temperature difference | Experimental example 3 | Comparative example 3 | Temperature difference |
| BF IC | 68.2 | 83.4 | 15.2 | 63.4 | 77.3 | 13.9 | 63.5 | 77.5 | 14.0 |
| PA 1 | 146.9 | 167.6 | 20.7 | 125.8 | 141.9 | 16.1 | 126.8 | 142.7 | 15.9 |
| PA 2 | 147.0 | 167.5 | 20.5 | 126.0 | 141.9 | 15.9 | 126.7 | 142.7 | 16.0 |
| PA 3 | 147.0 | 167.4 | 20.4 | 126.0 | 141.9 | 15.9 | 126.6 | 142.8 | 16.2 |
| PA 4 | 146.8 | 167.5 | 20.7 | 125.8 | 141.9 | 16.1 | 126.7 | 142.7 | 16.0 |

The simulation experiments are listed below to verify the effectiveness of the disclosure, but the disclosure is not limited to the following content.

Experimental Example 1 to Experimental Example 3 and Comparative Example 1 to Comparative Example 3

Experimental example 1 used an package structure similar to the package structure shown in FIG. 1 and FIG. 2 to simulate the heat distribution in the working mode. The substrate 100 of experimental example 1 was a printed circuit board (PCB), and the electronic component 110 was disposed on the substrate 100. The electronic component 110 included the first electronic component **110*a* and the multiple second electronic components 110*b*. The first electronic component 110*a* was a beamforming integrated circuit (IC) chip, and the multiple second electronic components 110*b***

Experimental Example 4 to Experimental Example 6 and Comparative Example 4 to Comparative Example 6

Experimental example 4 used a package structure similar to the package structure shown in FIG. 4 and FIG. 5 to simulate the heat distribution in the working mode. The substrate 100 of the package structure was a printed circuit board (PCB). The electronic component 110 was disposed on the substrate 100, and the electronic component 110 included the first electronic component **110*a* and the multiple second electronic components 110*b*. The first electronic component 110*a* was a beamforming IC chip, and the multiple second electronic components 110*b* were power amplifiers. The multiple heat conductors 120' were disposed around the multiple second electronic components 110*b*. The materials thereof were copper blocks, and each had the same volume. The second height H2 of the heat conductor 120' was the same as the first height H1 of the electronic component 110. The encapsulant 130 covered the side surfaces and the top surfaces of the first electronic component 110***a*, the second electronic component 110*b*, and the heat conductor 120'. The heat dissipation structure 140 was disposed on the encapsulant 130 and passed through the room temperature air flow at a velocity of 2 m/s.

Experimental example 5 was similar to experimental example 4, except that the substrate of experimental example 5 was a low temperature co-fired ceramic circuit board (LTCC), which did not have a cavity.

Experimental example 6 was similar to experimental example 5, except that the low temperature co-fired ceramic circuit board of experimental example 6 had a cavity.

Comparative example 4 to comparative example 6 were similar to experimental example 4 to experimental example 6 respectively, except that the package structures of comparative example 4 to comparative example 6 did not include the heat conductors.

When experimental example 4 to experimental example 6 and comparative example 4 to comparative example 6 were under the same simulation conditions, the package structure was numerically simulated in the working mode, and the junction temperature of each electronic component was obtained as shown in Table 2 below (BF IC in Table 2 refers to the first electronic component 110*a*, and PA1 to PA8 refer to the multiple second electronic components 110*b* arranged sequentially in a clockwise direction from the upper right corner of the first electronic component 110*a* in FIG. 4.)

TABLE 2

| | PCB | | | LTCC (without cavity) | | | LTCC (with cavity) | | |
|---|---|---|---|---|---|---|---|---|---|
| | Experimental example 4 | Comparative example 4 | Temperature difference | Experimental example 5 | Comparative example 5 | Temperature difference | Experimental example 6 | Comparative example 6 | Temperature difference |
| BF IC | 138.9 | 157.2 | 18.3 | 130.8 | 149.7 | 18.9 | 129.3 | 147.7 | 18.4 |
| PA 1 | 199.3 | 220.3 | 21.0 | 182.0 | 201.9 | 19.9 | 180.6 | 200.0 | 19.4 |
| PA 2 | 198.7 | 220.3 | 21.6 | 181.5 | 201.9 | 20.4 | 180.1 | 200.0 | 19.9 |
| PA 3 | 198.0 | 219.1 | 21.1 | 181.6 | 201.6 | 20.0 | 180.1 | 199.5 | 19.4 |
| PA 4 | 196.5 | 219.0 | 22.5 | 180.6 | 201.6 | 21.0 | 179.1 | 199.6 | 20.5 |
| PA 5 | 198.3 | 219.3 | 21.0 | 181.7 | 201.7 | 20.0 | 180.3 | 199.6 | 19.3 |
| PA 6 | 196.7 | 219.2 | 22.5 | 180.7 | 201.7 | 21.0 | 179.2 | 199.6 | 20.4 |
| PA 7 | 199.3 | 220.2 | 20.9 | 181.9 | 201.9 | 20.0 | 180.5 | 199.8 | 19.3 |
| PA 8 | 198.6 | 220.2 | 21.6 | 181.4 | 201.9 | 20.5 | 180.0 | 199.8 | 19.8 |

From Table 1 and Table 2, it may be seen that the package structures of experimental example 1 to experimental example 3 were provided with aluminum nitride blocks as heat conductors and the package structures of experimental example 4 to experimental example 6 were provided with copper blocks as heat conductors. Compared with comparative example 1 to comparative example 6, the temperature of the first electronic component and the second electronic component may be significantly reduced, indicating that the heat conductor may help the heat dissipation of the electronic component. In addition, it may be seen from experimental example 3 and experimental example 6 that even if the LTCC circuit board had a cavity, it may still obtain a similar and favorable heat dissipation effect as with the heat dissipation effect of the LTCC circuit board without a cavity (i.e., experimental example 2 and experimental example 5).

Experimental Example 7

Experimental example 7 was aimed at simulating the influence on the junction temperature of the electronic components when the heat conductors had different second heights in the working mode of the package structure. Experimental example 7 was based on a package structure similar to the package structure shown in FIG. 1 and FIG. 2. Under the same simulation conditions, the third height H3 (set as 1 mm here) of the encapsulant 130 and the first height H1 of the electronic component 110 (set as 0.8 mm here) were fixed, and the second height H2 of the heat conductor 120 was changed, so as to simulate the junction temperature of the electronic component 110. The substrate 100 of experimental example 7 was a printed circuit board (PCB). The electronic component 110 was disposed on the substrate 100, and the electronic component 110 included the first electronic component 110*a* and the multiple second electronic components 110*b*. The first electronic component 110*a* was a beamforming integrated circuit (IC) chip, and the multiple second electronic components 110*b* were power amplifiers. The multiple heat conductors 120 were disposed on the substrate 100 and located between the adjacent second electronic components 110*b*. The materials thereof were aluminum nitride blocks, and each had the same volume. The film encapsulation 130 covered the side surfaces and the top surfaces of the first electronic component 110*a*, the second electronic component 110*b*, and the heat conductor 120. The heat dissipation structure 140 was disposed on the encapsulant 130, and passed through the room temperature air flow at a velocity of 2 meters per second (m/s).

Figure 6:
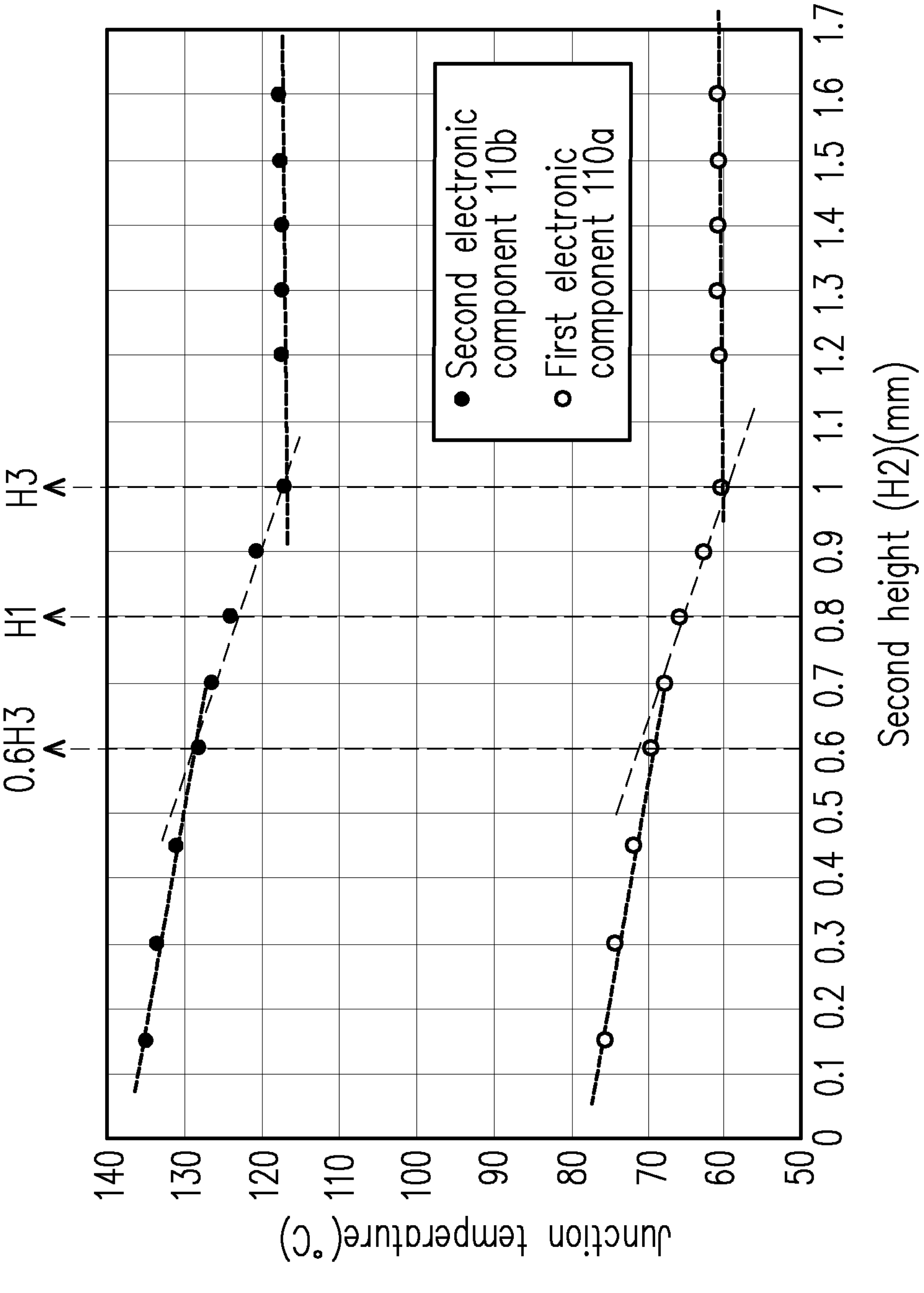
FIG. 6 is a relationship diagram between a height of a heat conductor and a junction temperature of an electronic component.

FIG. 6 is a relationship diagram between a height (i.e., the second height) of a heat conductor and a junction temperature of an electronic component. The junction temperatures in FIG. 6 are represented by the highest junction temperatures of the first electronic component 110*a* and the second electronic component 110*b*, respectively.

The simulation result of experimental example 7 is shown in FIG. 6. It may be seen from FIG. 6 that when the second height H2 was less than 0.6 millimeters (i.e., 0.6 times the third height H3), the degree of decrease of the junction temperature of the first electronic component 110*a* and the second electronic component 110*b* decreased slightly with the increase of the second height H2, but was not significant. When the second height H2 was greater than or equal to 0.6 mm and less than or equal to 1 mm, the junction temperature of the first electronic component 110*a* and the second electronic component 110*b* significantly decreased, and as the second height H2 increased, the degree of decrease of the junction temperature also increased accordingly, which was beneficial to the heat dissipation of the electronic component 110. When the second height H2 was greater than 1 mm (i.e., the third height H3), the junction temperature of the first electronic component 110*a* and the second electronic component 110*b* was almost equal, and it may be seen that the second height H2 of the heat conductor 120 being greater than the third height H3 of the encapsulant 130 did not further improve the cooling of the electronic component 110.

Experimental Example 8

Experimental example 8 was aimed at simulating the influence on the junction temperature of the electronic components when the heat conductors had different areas in the working mode of the package structure. Experimental example 8 was similar to the package structure shown in FIG. 1 and FIG. 2. Under the same simulation conditions, the second height H2 of the heat conductor 120 (set as 0.8 mm here) and the area and the first height H1 (set as 0.8 mm here) of the electronic component 110 were fixed, and the area of the heat conductor 120 was changed, so as to simulate the junction temperature of the electronic component 110. The substrate 100 of experimental example 8 was a printed circuit board (PCB). The electronic component 110 was disposed on the substrate 100, and the electronic component 110 included the first electronic component 110*a* and the multiple second electronic components 110*b*. The first electronic component 110*a* was a beamforming integrated circuit (IC) chip, and the multiple second electronic components 110*b* were power amplifiers. The multiple heat conductors 120 were disposed on the substrate 100 and located between the adjacent second electronic components 110*b*. The materials thereof were aluminum nitride blocks, and each had the same volume. The film encapsulation 130 covered the side surfaces and the top surfaces of the first electronic component 110*a*, the second electronic component 110*b*, and the heat conductor 120. The heat dissipation structure 140 was disposed on the encapsulant 130, and passed through the room temperature air flow at a velocity of 2 meters per second (m/s).

Figure 7:
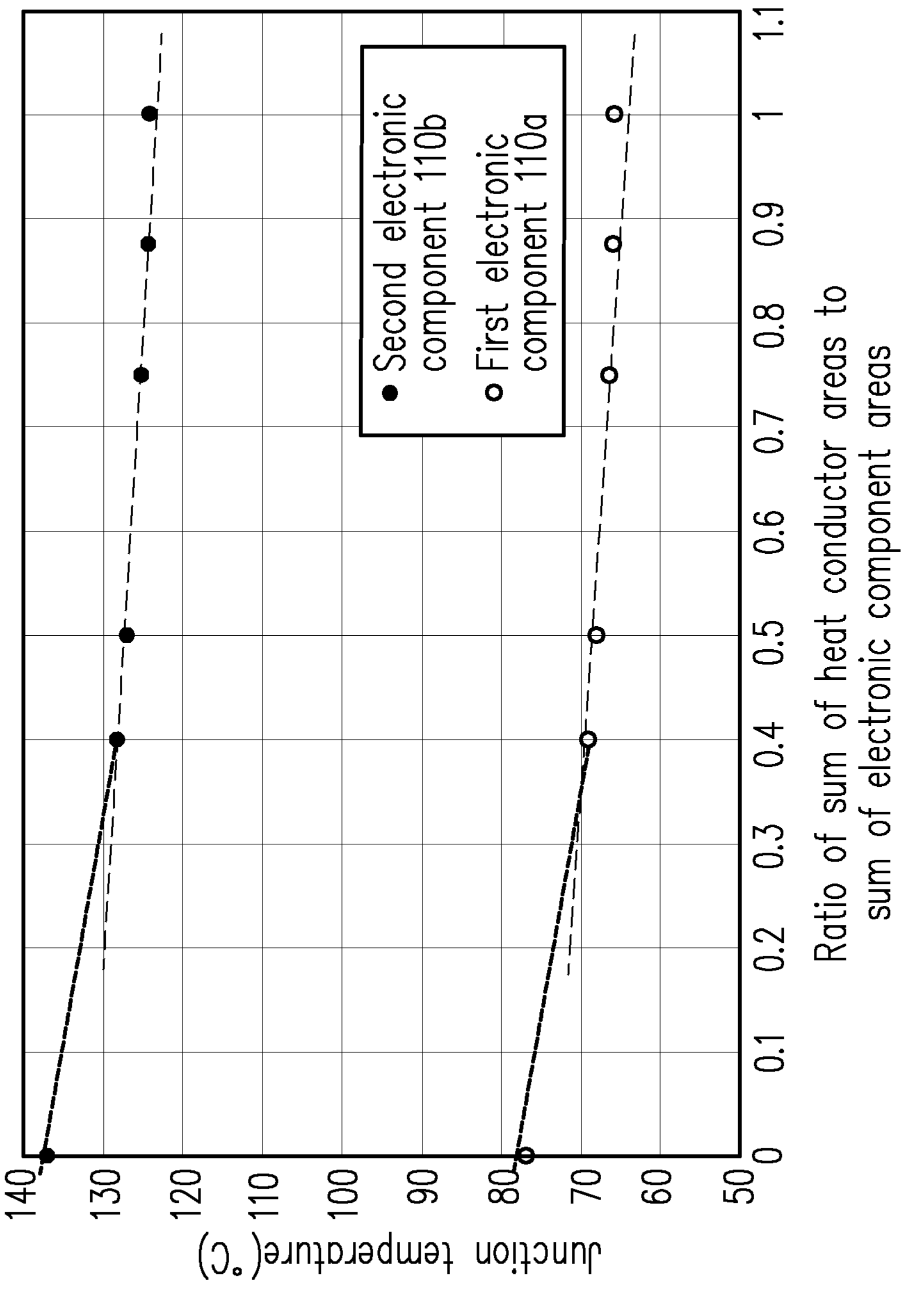
FIG. 7 is a relationship diagram between a ratio of a sum of heat conductor areas to a sum of electronic component areas and a junction temperature of an electronic component.

FIG. 7 is a relationship diagram between a ratio of a sum of heat conductor areas to a sum of electronic component areas and a junction temperature of an electronic component. The junction temperatures in FIG. 7 are represented by the highest junction temperatures of the first electronic component 110*a* and the second electronic component 110*b*, respectively.

The simulation result of experimental example 8 is shown in FIG. 7. It may be seen from FIG. 7 that when the ratio of the sum of the area of the heat conductor 120 to the sum of the area of the electronic component 110 was greater than 0.4, the junction temperature of the first electronic component 110*a* and the second electronic component 110*b* significantly decreased, and as the area of the heat conductor 120 increased (i.e., the ratio of the sum of the area of the heat conductor 120 and the sum of the area of the electronic component 110 increased), the degree of decrease of the junction temperature also increased accordingly, which contributed to the heat dissipation of the electronic component 110. To sum up, the package structure of the disclosure includes the heat conductors and the electronic components disposed on the substrate, and the heat conductors are located in the heat-generating area, which may effectively conduct the heat emitted by the electronic components to reduce the temperature of the electronic components, so that the temperature accumulated on the bearing surface of the substrate may be reduced and the overall heat dissipation effect of the package structure may be improved so as to further improve the reliability thereof.

What is claimed is:

1. A package structure, comprising:

a substrate, having a bearing surface and substrate pads on the bearing surface;

an electronic component, disposed on the bearing surface through a portion of the substrate pads, wherein the electronic component has a first height;

at least one heat conductor, disposed on the bearing surface, wherein the at least one heat conductor has a second height;

an encapsulant, disposed on the bearing surface, and having a side covering the electronic component and the at least one heat conductor, wherein the encapsulant has a third height, and the third height is greater than or equal to the first height and the third height is greater than or equal to the second height; and a heat dissipation structure, disposed on the encapsulant, wherein a surrounding area where the substrate is in contact with the electronic component defines a heat-generating area, and the at least one heat conductor is disposed in the heat-generating area, wherein the at least one heat conductor comprises a ceramic material, and the at least one heat conductor is fixed on another portion of the substrate pads through connectors, wherein an orthographic projection of the another portion of the substrate pads on the substrate is overlapped with an orthographic projection of the heat conductor on the substrate but not overlapped with an orthographic projection of the electronic component on the substrate, wherein the substrate comprises an air gap, and an orthographic projection of the air gap on the substrate overlaps the orthographic projection of the electronic component on the substrate but does not overlap the orthographic projection of the at least one heat conductor on the substrate.

2. The package structure according to claim 1, wherein a ratio of the second height to the third height is not less than 0.6 and not greater than or equal to 1.

3. The package structure according to claim 1, wherein a difference between the third height and the first height is less than 0.3 mm.

4. The package structure according to claim 1, wherein a top surface of the encapsulant is substantially aligned with a top surface of the at least one heat conductor.

5. The package structure according to claim 1, further comprising:

a heat interface material, disposed between the heat dissipation structure and the encapsulant.

6. The package structure according to claim 1, wherein the substrate comprises a printed circuit board or a low temperature co-fired ceramic circuit board.

7. The package structure according to claim 1, wherein the ceramic material comprises aluminum nitride, boron nitride, indium nitride, or boron arsenide.

8. The package structure according to claim 1, wherein a ratio of a sum of an orthographic projection area of the at least one heat conductor on the substrate to a sum of an orthographic projection area of the electronic component on the substrate is 0.4 or more in the heat-generating area.

9. The package structure according to claim 1, wherein the electronic component is provided in plurality, and the at least one heat conductor is disposed between adjacent electronic components.

10. The package structure according to claim 1, wherein the at least one heat conductor is provided in plurality, and the plurality of heat conductors are disposed around the electronic component.

11. The package structure according to claim 1, wherein the at least one heat conductor is integrally formed with the heat dissipation structure.

12. The package structure according to claim 1, wherein the at least one heat conductor comprises four heat conductors, and the four heat conductors are respectively located next to four side surfaces of the electronic component.

* * * * *